United States Patent
Petrov

(10) Patent No.: US 6,897,442 B2
(45) Date of Patent: May 24, 2005

(54) OBJECTIVE LENS ARRANGEMENT FOR USE IN A CHARGED PARTICLE BEAM COLUMN

(75) Inventor: Igor Petrov, Holon (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 10/423,289

(22) Filed: Apr. 25, 2003

(65) Prior Publication Data
US 2004/0211913 A1 Oct. 28, 2004

(51) Int. Cl.⁷ .................. H01J 37/145; H01J 37/244
(52) U.S. Cl. .............. 250/310; 250/396 R; 250/397; 250/396 ML
(58) Field of Search .................. 250/310, 396 R, 250/397, 396 ML

(56) References Cited

U.S. PATENT DOCUMENTS

| | | | |
|---|---|---|---|
| 4,926,054 A | | 5/1990 | Frosien |
| 5,895,917 A | * | 4/1999 | Ueda et al. .............. 250/310 |
| 6,037,589 A | * | 3/2000 | Yonezawa et al. .......... 250/310 |
| 6,232,601 B1 | * | 5/2001 | Schmitt et al. ............ 250/310 |
| 6,407,388 B1 | | 6/2002 | Frosien |
| 6,590,210 B1 | * | 7/2003 | Essers .................... 250/310 |

FOREIGN PATENT DOCUMENTS

WO    WO-9946797    9/1999

OTHER PUBLICATIONS

Frosien, J., et al., "Compound Magnetic And Electrostatic Lenses For Low–Voltage Applications", *Journal of Vacuum Science And Technology: PART B*, American Institute of Physics, New York US, vol. 7, No. 6, 18XP000117179, ISSN: 1071–1023, (Nov. 1, 1989), 1871–1877.

Search Report, "International Searching Authority", *PCT/US2004/12468*, (Apr. 22, 2004).

* cited by examiner

Primary Examiner—John R. Lee
Assistant Examiner—Paul M. Gurzo
(74) Attorney, Agent, or Firm—Blakely, Sokoloff, Taylor & Zafman

(57) ABSTRACT

An objective lens arrangement is presented for mounting in a charged particle beam column adjacent to an anode tube that defines a beam drift space for a charged particle beam propagating towards a sample. The lens arrangement comprises a magnetic lens and an electrostatic lens, wherein the electrostatic lens includes upper and lower electrodes arranged in a spaced-apart coaxial relationship along an optical axis of the lens arrangement.

21 Claims, 3 Drawing Sheets

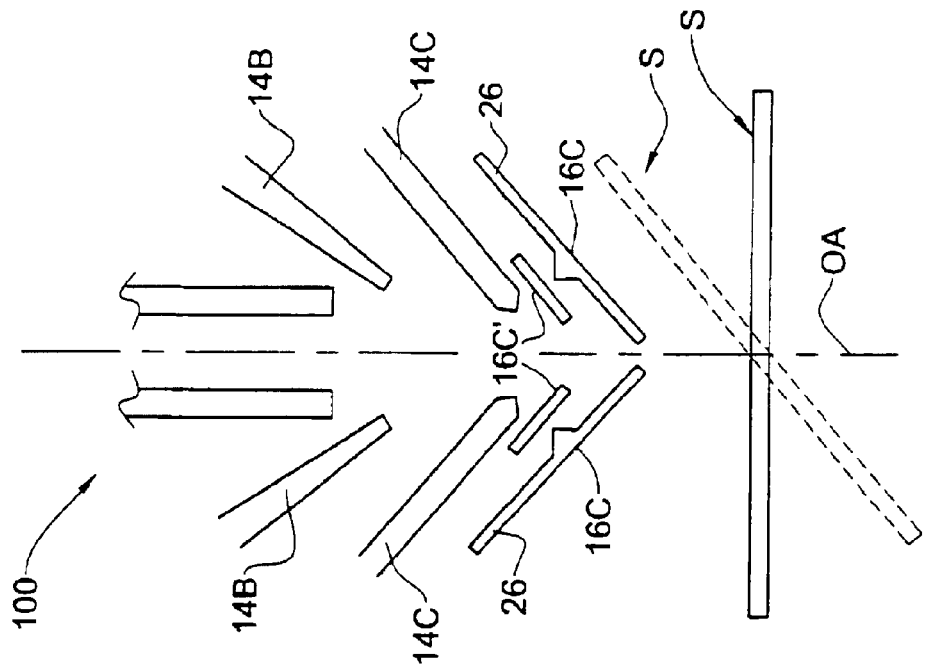
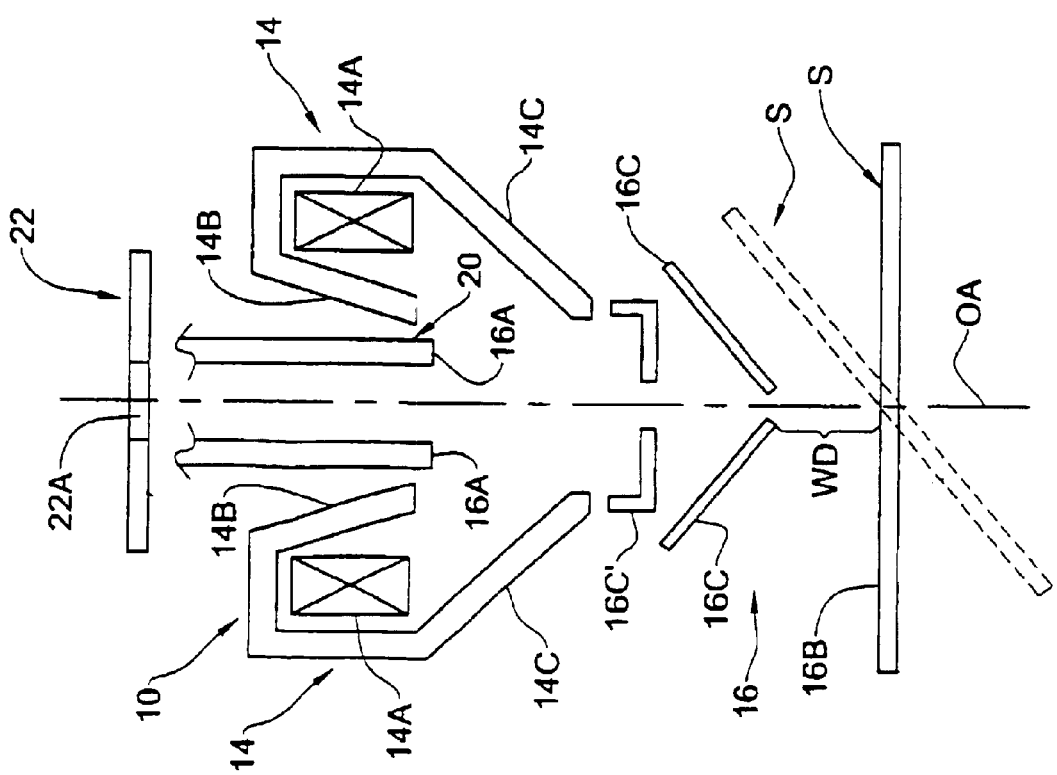
FIG. 1A
FIG. 1B

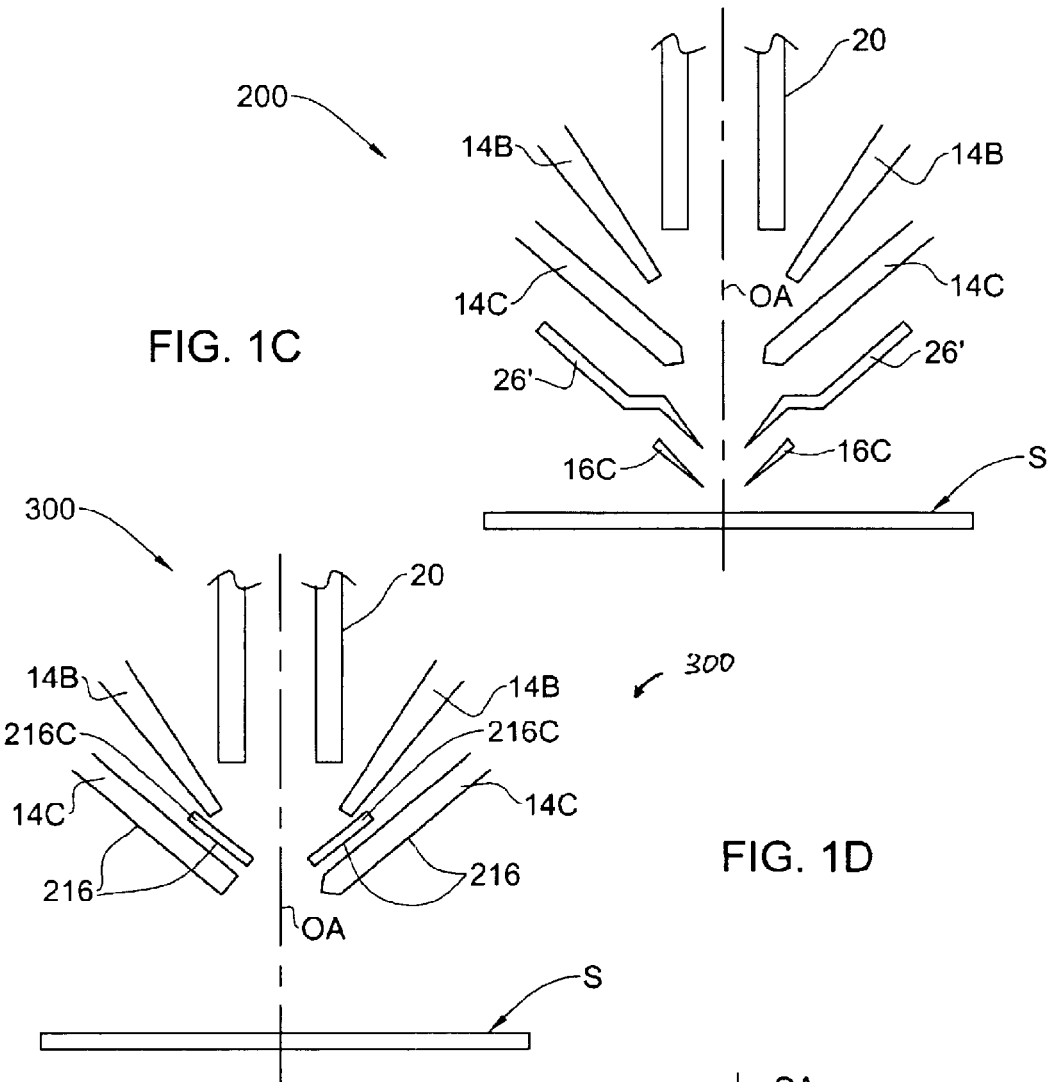
FIG. 1C
FIG. 1D
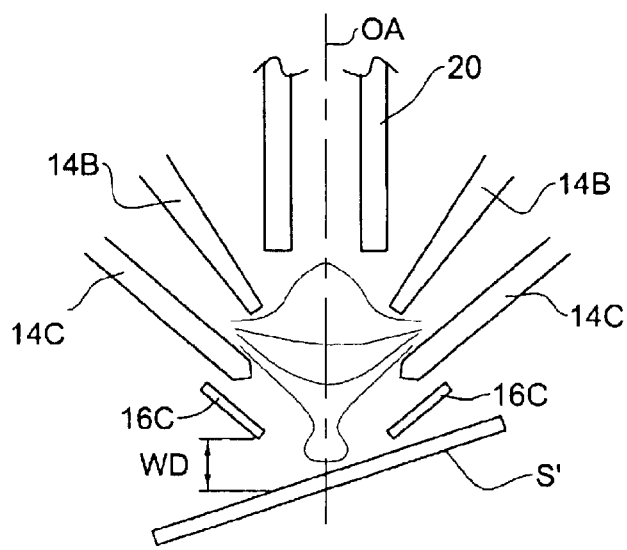
FIG. 2

OBJECTIVE LENS ARRANGEMENT FOR USE IN A CHARGED PARTICLE BEAM COLUMN

FIELD OF THE INVENTION

The present invention is in the field of inspection/measurement techniques of the kind utilizing irradiation of a sample by a focused beam of electrically charged particles, such as electrons, positrons, or ions, and relates to an objective lens arrangement for use in a charged particle beam column.

BACKGROUND OF THE INVENTION

Charged particle beam columns are typically employed in scanning electron microscopy (SEM), which is a known technique widely used in the manufacture of semiconductor devices, being utilized in CD metrology tools, the so-called CD-SEM (Critical Dimension Scanning Electron Microscope) and defect review SEM (DR-SEM). In an SEM, the region of a sample to be examined is two-dimensionally scanned by means of a focused primary beam of electrically charged particles, usually electrons. Irradiation of the sample with the primary electron beam releases secondary (and/or backscattered) electrons. The secondary electrons are released at that side of the sample at which the primary electron beam is incident, and move back to be captured by a detector, which generates an output electric signal proportional to the so-detected electric current. The energy and/or the energy distribution of the secondary electrons is indicative of the nature and composition of the sample.

The inspection of a sample with a DR-SEM requires a certain, relatively high tilt (as compared to that required for CD-measurements) of the sample's surface with respect to the incident electron beam (e.g., 45 degrees angle of incidence). When inspecting patterned samples, such as semiconductor wafers, having a pattern in the form of a plurality of spaced-apart grooves, tilting of the sample is needed to detect the existence of a foreign particle located inside a narrow groove.

It is known to implement a tilt mechanism by either mechanically tilting the sample's carrier with respect to the charged particle beam column or tilting the column with respect to the sample's carrier, or both (e.g., U.S. Pat. Nos. 5,329,125; 5,734,164; 5,894,124; 6,037,589). It is also known to achieve a tilt mechanism by affecting the trajectory of the primary electron beam using single- or double-deflection, the so-called "electronic tilt" (e.g., WO 01/45136 and U.S. Pat. No. 6,380,54, assigned to the assignee of the present application).

One of the common goals of all imaging systems consists of increasing the image resolution. In SEM, in order to reduce the "spot" size of the electron beam up to nanometers, a highly accelerated electron beam is typically produced using accelerating voltages of several tens of kilovolts and more. Specifically, the electron optic elements are more effective (i.e. produce smaller aberrations) when the electrons are accelerated to high kinetic energy. However, it has been observed that such a highly energized electron beam causes damage to resist structures and integrated circuits, and, in the case of dielectrical specimens, causes undesirable charging of the specimen. Therefore, the primary electron beam is decelerated just prior to impinging onto the sample by an electric field created in the vicinity of the sample. This electric field, while decelerating the primary electrons, accelerates secondary electrons released at the sample.

The above can be implemented by using an objective lens arrangement in the form of a combination of a magnetic objective lens and an electrostatic lens (e.g., WO 01/45136, EP 1045425, U.S. Pat. No. 6,380,546, all assigned to the assignee of the present application, and WO 01/5056). The electrostatic part of such a compound magnetic-electrostatic lens is an electrostatic retarding lens (with respect to the primary charged particle beam), which has two electrodes held at different potentials, one of the two electrodes being formed by a cylindrical anode tube that defines a beam drift space and is arranged within a magnetic objective lens along its optical axis, and the other electrode being a metallic cup provided below the magnetic objective lens. Generally, the electrostatic part of the objective lens arrangement may not be implemented as a separate electrostatic lens, but rather by applying appropriate voltages to the anode tube and the sample, or to the anode tube, the polepiece of the magnetic objective lens and the sample.

The operation with low primary beam energies (less than 1 keV), especially in large mechanical tilts (e.g., 45 degrees), limits the system resolution due to high chromatic aberration of the electrostatic part of the lens arragement, namely, the distribution of the electrostatic field in the vicinity of the sample. Due to the variance in energy, the primary beam particles are typically dispersed into beam components formed by, respectively, particles of average energy, particles of relatively high-energy, and particles of relatively low-energy. The high-energy particles are less diffracted than the low-energy particles. This difference causes the enlargement of the diameter of the charged particle beam, and consequently, the reduction of resolution. This is also referred to as chromatic aberrations of focusing. The low-energy beam is characterized by more expressed chromatic aberrations than the high-energy beam.

U.S. 20010011702 discloses a technique of observing semiconductor wafer is inclined or tilted at large angles. This technique utilizes a composite lens consisting essentially of a single-pole or monopole magnetic field type lens and an electrostatic field invasive lens, whereas an electrode of the electrostatic field invasive lens which opposes the wafer is made of a magnetic material while letting a high voltage of the negative polarity be applied to this electrode and the wafer.

SUMMARY OF THE INVENTION

There is a need in the art to facilitate the monitoring of samples with a charged particle beam, by providing a novel objective lens arrangement for use in a charged particle beam column. Here, the term "monitoring" signifies at least one of the inspection and measurement techniques.

The term "primary beam" used herein (being also referred to as "primary charged particle beam" or "primary electron beam") signifies a charged particle beam, which is formed by charged particles generated by a source (cathode) of these particles, and which is to be directed to a sample to release charged particles forming a "secondary beam" (also referred to as "secondary charged particle beam or secondary electron beam), which is to be detected.

The present invention is aimed at solving a problem of improving the resolution in a DR-SEM column, especially for low primary beam energies (less than 1 keV), for both the operation with large angles of the primary beam incidence (e.g., 45 degrees) and the operation with normal incidence of the beam onto the sample. Although appropriate regulation of the electrostatic field by a voltage supply to a cap-electrode enables the reduction of chromatic aberration when operating with the normal incidence of the primary beam onto the sample and with the HAR mode (high gradient electric field in the vicinity of the sample, e.g., $V_{cap}$=3 kV), this approach does not provide sufficient reduction of chromatic primary beam while operating with a relatively low-gradient electric field in the vicinity of the sample (e.g., zero voltage on the cap-electrode $V_{cap}$=0 V).

Another problem to be solved is avoidance of the creation of a strong electrostatic field between the lowermost electrode of the lens arrangement (e.g., cap-electrode in a specific configuration) and the tilted sample. To this end, the cap is to be formed with a small opening (about 2 mm), otherwise deflecting and the resolution. The use of a smaller opening impedes the collection of secondary electrons, especially when operating with a so-called "in-lens" or "in-column" detector, and, on the other hand, significantly reduces the electrostatic field in the vicinity of the sample, which might reduce the resolution. The in-lens or in-column detector is typically a plate-like detector formed with an opening surrounded by sensing regions, and is accommodated in the path of a primary beam such that the primary beam propagation axis intersects with said opening, which therefore serves as the primary beam hole.

The present invention solves the above problems (limitation in the improvement of the image resolution and in the minimal beam energy that can be effectively focused) by providing an objective lens arrangement including a magnetic part and an electrostatic part, wherein the electrostatic part of the lens arrangement includes two electrodes (preferably conically shaped) accommodated in a spaced-apart coaxial relationship (the so-called "double-cap" assembly) along the optical axis of the lens arrangement. The magnetic part of the objective lens arrangement is a magnetic lens typically formed by coils and two polepieces. The double-electrode assembly may be configured as a separate double-electrode assembly located downstream of the magnetic objective lens (with respect to the primary beam propagation direction), namely, below the lowermost polepiece of the magnetic lens. Alternatively, the double-electrode assembly may be formed by the lowermost polepiece of the magnetic lens and an additional electrode (preferably conical) located between the upper and lower polepieces of the magnetic lens. In this case, either the lower polepiece of the magnetic lens is electrically insulated from the other polepiece, or a certain voltage is supplied to the sample.

There is thus provided according to one aspect of the present invention, an object lens arrangement for mounting in a charged particle beam column adjacent to an anode tube that defines a beam drift space for a charged particle beam propagating towards a sample, the lens arrangement comprising a magnetic lens and an electrostatic lens, wherein the electrostatic lens includes upper and lower electrodes arranged in a spaced-apart coaxial relationship along an optical axis of the lens arrangement.

Preferably, the either one of upper and lower electrodes or both of them are made of a magnetic material like mu-metal, to shield magnetic disturbance fields. Preferably, at least the lower electrode of the electrostatic lens is conically shaped, and more preferably, both the upper and lower electrodes are conically shaped. This enables to decrease an effective working distance, which is the distance between the sample plane and a plane of the electrode closest to the sample measured along the optical axis of the lens arrangement. The upper electrode may be a multiple-electrode structure, such as dipole, quadruple, or octupole, and may therefore operate as a beam deflector.

The magnetic lens comprises coils, an upper polepiece and a lower polepiece, which has a substantially conical shape. The electrostatic lens may be formed by a voltage supply to the anode tube, the upper and lower electrodes, and the sample. The lower and upper electrodes of the electrostatic lens may be constituted by, respectively, the lower polepiece of the magnetic lens and the electrode located between the upper and lower polepieces of the magnetic lens; or may be two electrodes located below the lower polepiece of the magnetic lens.

Either one of the upper and lower electrodes may be formed with an additional conical part extended from the center of the cone so as to be around a bottom end of the lower polepiece of the magnetic lens.

According to another aspect of the present invention, there is an objective lens arrangement for mounting in a charged particle beam column adjacent to an anode tube that defines a beam drift space for a charged particle beam propagating towards a sample, the lens arrangement comprising a means for creating a magnetic field and a means for creating an electrostatic field, wherein said means for creating the electrostatic field includes upper and lower electrodes arranged in a spaced-apart coaxial relationship along an optical axis of the lens arrangement, each of the upper and lower electrodes being and associated with a separate voltage supply.

According to yet another aspect of the invention, there is provided a charged particle beam column for monitoring a sample, the column comprising an anode tube defining a beam drift space for a charged particle beam propagation towards the sample, and an objective lens arrangement mounted adjacent to said anode tube such that an optical axis of the lens arrangement substantially coincides with a longitudinal axis of the anode tube, the lens arrangement comprising a magnetic lens and an electrostatic lens, wherein the electrostatic lens includes upper and lower electrodes arranged in a spaced-apart coaxial relationship along the optical axis of the lens arrangement.

According to yet another aspect of the invention, there is provided a method of focusing a charged particle beam onto a sample while propagating through a charged particle beam column, the method comprising: passing the charged particle beam through an objective lens arrangement having a magnetic lens and an electrostatic lens, wherein the electrostatic lens includes upper and lower electrodes arranged in a spaced-apart coaxial relationship along an optical axis of the lens arrangement; applying a predetermined voltage to said upper electrode to adjust a position of the principal plane of the lens arrangement to provide a desired magnification coefficient and numerical aperture of the lens arrangement. By this, the adjustment of the principal plane optimum resolution can be achieved.

According to yet another aspect of the invention, there is provided a method of focusing a charged particle beam onto a sample with reduced chromatic aberration, while propagating the beam through a charged particle beam column, the method comprising: passing the charged particle beam through an objective lens arrangement having a magnetic lens and an electrostatic lens, wherein the electrostatic lens includes upper and lower electrodes arranged in a spaced-apart coaxial relationship along an optical axis of the lens arrangement; and regulating a voltage supply to said upper electrode.

According to yet another aspect of the invention, there is provided a method of focusing a charged particle beam onto a sample while propagating the through a charged particle beam column, the method comprising accelerating the charged particle beam on its way towards an objective lens arrangement and decelerating the accelerated charged particle beam in the vicinity of the sample, wherein said decelerating comprises passing the charged particle beam through openings in upper and lower electrodes arranged in a spaced-apart coaxial relationship along the beam propagation axis, thereby reducing a minimal energy of the effectively focusable charged particle beam.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIGS. 1A to 1D schematically illustrate a part of a charged particle beam column utilizing an objective lens arrangement according to several examples of the invention, respectively, including an electrostatic lens having an additional electrode thereby forming a double-cap assembly;

FIG. 2 schematically shows a lens arrangement with no such additional electrode, but a single-cap electrode.

DETAILED DESCRIPTION OF THE INVENTION

Figure 3A:
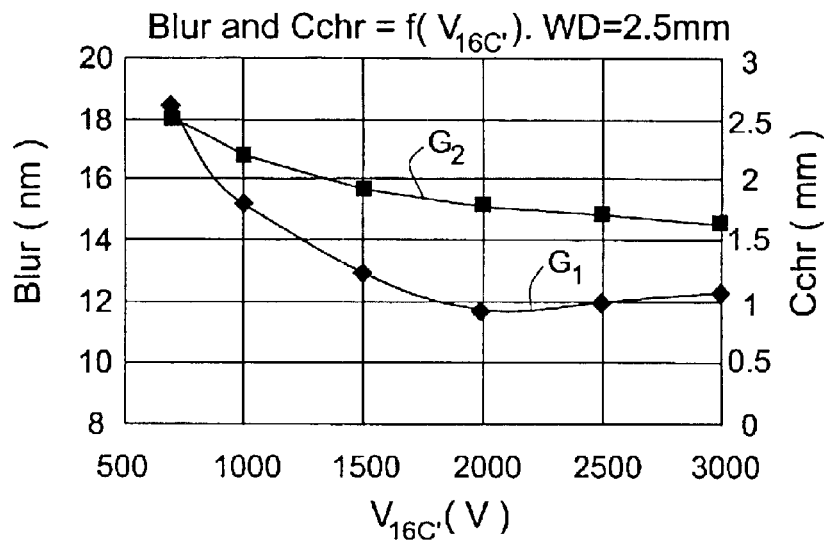
FIGS. 3A to 3C illustrate the experimental results obtained with the lens arrangement of the present invention.

Referring to FIG. 1A, there is schematically illustrated a part of a charge particle beam column (such as an SEM) including an objective lens arrangement, generally at 10, associated with a sample S under inspection. The lens arrangement 10 includes a magnetic lens 14 and an electrostatic lens 16. Further provided in this part of the charged particle beam column is an in-lens detector 22 located above the lens 14 such that an optical axis OA of the lens arrangement passes through an opening 22A (primary beam hole) in the detector.

The magnetic lens 14 is formed by excitation coils 14A and two pole pieces 14B and 14C. The electrostatic lens 16 is formed by following electrodes: electrode 16A—the lower end of an anode tube 20, electrode 16B—the sample's surface, and "cap" electrodes 16C and 16'C arranged in a spaced-apart relationship along the optical axis OA of the lens arrangement between the electrodes 16A and 16B. The electrodes 16C and 16C' are separately operated by a voltage supply (not shown), and are preferably made of mu-meal for better magnetic immunity (less noise). In order to affect the charged particle beam trajectory (deflection) for example for the fast scan purpose, the electrode 16C' can be designed as a multiple-electrode structure, such as a dipole quadruple, or octupole structure. At least the lower electrode 16C of the double-electrode assembly is preferably conically shaped. This is associated with a need for as small as possible "effective" working distance WD (which is a distance between the plane defined by the lowermost electrode of the lens arrangement and the sample plane measured along the optical axis OA) when operating with a tilted sample. As shown in the figure, when the sample is tilted, is is substantially parallel to the electrode 16C.

In the present example, a 45°-tilt (an angle between the optical axis OA and the sample's plane) is achieved by mechanically tilting the sample with respect to the lens arrangement. It should, however, be understood that the same can be achieved by tilting the lens arrangement (or the entire column) with respect to the sample.

In the example of FIG. 1A, the upper electrode 16C' of the double-electrode assembly is substantially planar (i.e., perpendicular to the optical axis OA). As indicated above, both electrodes of the double-electrode configuration may be conically shaped.

FIG. 1B illustrates an objective lens arrangement 100 according to another example of the invention. To facilitate understanding, the same reference numbers are used for identifying components that are common for all the examples. Thus, in the example of FIG. 1B, both upper and lower electrodes 16C and 16C' are conically shaped, and the lower electrode 16C is formed with an additional conical part 26 (shielded electrode) around the bottom end of the lower polepiece 14C of the magnetic lens 14. FIG. 1C illustrates an objective lens arrangement 200 according to yet another example of the invention, wherein the upper electrode 16C' of the double-cap assembly is formed with an additional conical part 26' around the bottom end of the lower polepiece 14C of the lens 14.

The provision of this conical part 26 (or 26') is optional, and serves for providing better balance of the collection of secondary electrons on two outside detectors (not shown). This is associated with the following. The radius of the magnetic lens (with no cap-electrode) is typically about 15–16 mm. The magnetic field created by such a magnetic lens thus propagates out of the magnetic lens towards the sample and twists secondary electrons in the vicinity of the sample. This results in different signals detected by the outside detectors. The extended conical part 26 of the cap-electrode partly shields the magnetic field, thereby actually reducing the effective diameter of the magnetic lens (from a point of the magnetic field propagation from the magnetic lens to the sample) resulting in the uniform signals at both outside detectors.

In the examples of FIGS. 1A–1C, the electrostatic part of the lens arrangement is implemented as a separate double-cap electrode assembly. FIG. 1D exemplifies a lens arrangement 300 in which the electrostatic part of the lens utilizes the power polepiece of the magnetic lens. More specifically, a double-cap assembly 216 is formed by the lowermost polepiece 14C of the magnetic lens 14 and an electrode 216C between the polepieces 14B and 14C of the magnetic lens.

The advantageous use of a double-cap electrostatic part of the lens arrangement (either as a separate double-electrode assembly below a two-polepieces magnetic lens, or as an assembly formed by the lower polepiece of the magnetic lens and an electrode between the polepieces) is associated with the following:

Let us consider the objective lens arrangement shown in FIG. 2, which is generally similar to that of FIG. 1A, but has a single cap-electrode 16C (no additional electrode 16C'). In this example, the electrostatic part of the lens arrangement is an electrostatic lens formed by electrode 16A (anode tube), electrode 16B (sample) and a conical cap-electrode 16C between the polepiece 14C and the sample 16B. The optical force of such an objective lens arrangement is defined by the geometry of the electrodes and the potential difference between the anode 16A and the cap electrode 16C. When using a conical cap, the equipotential lines of the electric field are strongly curved, and thus a higher optical force of the lens arrangement is provided. Generally, the optical force of the lens arrangement should be such that, at a 45°-tilt, a field created by the magnetic objective lens enables effective focusing of the low energy primary beam electrons onto the tilted sample. It is also important to provide no strong electrostatic field between the cap and the tilted sample. To this end, the cap electrode 16C is formed with a small opening at the top of the cone (about 2 mm), otherwise deflecting and multi-pole field components occur, thus reducing the resolution. The use of a smaller opening impedes the collection of secondary electrons, especially when operating with the in-lens detector, and may also reduce the resolution, since in this case, the electrostatic field in the vicinity of the sample is significantly reduced. The optical force of the lens arrangement is even affected by the thickness of the conical cap wall: the thinner the wall, the higher the optical force. Thus, the fixed geometry of the electrodes in such a lens and voltage between the electrodes induce a limitation for improving the resolution because of a too high coefficient of chromatic aberration, and induce limitation for minimizing the primary beam energy that can be effectively focused at the 45°-tilt of the sample due to the fixed value of the optical force of the lens arrangement. Although decreasing the anode voltage reduces the minimal primary beam energy that can be effectively focused, this results in an increase of the coefficient of chromatic aberration, and consequently in the reduction of resolution, and results in the reduction of the effectiveness of the detection of secondary electrons by an in-lens detector.

With the lens arrangement of the present invention (FIGS. 1A–1D), by providing an appropriate voltage supply to the additional electrode 16C', the optical force of the entire lens arrangement can be regulated, the Zoom Lens mode of the lens arrangement can be provided, and chromatic aberration can be affected (which is the dominant factor affecting the resolution).

Generally, a relative position of the principal plane of a lens arrangement affects the magnification coefficient of the lens arrangement and the numerical aperture (angel of beam convergence in the image plane, which should be optimal for diffraction effects especially for low energy primary electrons). When the additional electrode 16C' is supplied with a voltage equal to that of the cap electrode 16C ($V_{16C'}=V_{16C}$), the principal plane of the lens arrangement becomes located closer to the anode, resulting in a decrease of the numerical aperture of the lens arrangement and consequently in an increase of the coefficient of magnification. Applying the same voltage to the anode 16A and additional electrode 16C' ($V_{16C'}=V_{16A}$) results in that the principal plane of the lens arrangement is displaced towards the sample, thus increasing the numerical aperture and decreasing the magnification coefficient.

Figure 3B:
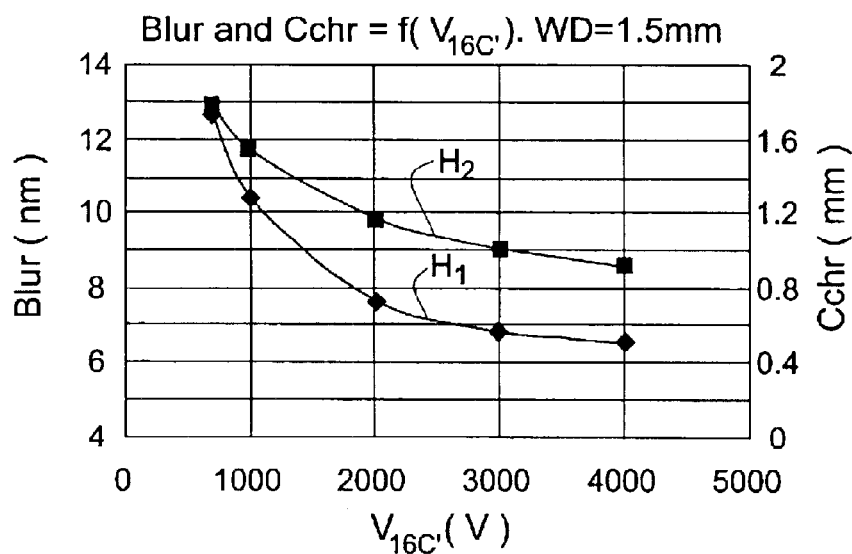
Figure 3C:
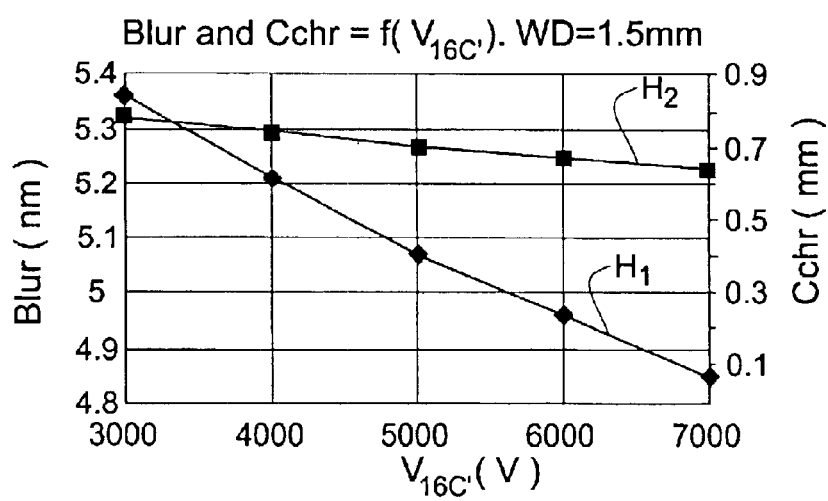

Reference is now made to FIGS. 3A–3C illustrating simulation results obtained with a model of the lens arrangement illustrated at FIG. 1C, according to the invention with the following common conditions: the primary beam energy E=600 eV, FA=15 μm (final aperture dimension, the final aperture is positioned in proximity (about 50 mm below) of the electron tip and defined the angle of the flux at the object plain, Vanode=8 kV.

FIG. 3A shows the image blur as a function of voltage applied to the additional electrode 16C' (graph $G_1$–Blur=f($V_{16C'}$)) and the chromatic aberration coefficient as a function of voltage applied to the additional electrode 16C' (graph $G_2$–Cchr=f($V_{16C'}$)) while operating with a 45° mechanical tilt, $V_{16C}=0$ V, and WD=2.5 mm. As shown, appropriately increasing $V_{16C'}$ provides for the reduction of the chromatic aberration and the image blur (increase of resolution). It should, however, be understood that while increasing $V_{16C'}$ to a higher potential (e.g., about 3 kV), the electrostatic field in the vicinity of the sample becomes increased which, as indicated above, would impede the collection of secondary electrons.

The following table presents the dependency of the entire set of measurable parameters (including also the lens magnification M, numerical aperture NA, and spherical aberration $C_{sph}$) on the voltages applied to the electrodes 16C and 16C':

| | OLC (Please clarify) (mA) | M | NA (mrad) | Csph (mm) | Chr (mm) | Blur* (nm) |
|---|---|---|---|---|---|---|
| $V_{16C'}$ = 700 V<br>$V_{16C}$ = 0 V | 365 | 0.0476 | 11.6 | 8.22 | 2.50 | 18.4 |
| $V_{16C'}$ = 1000 V<br>$V_{16C}$ = 0 V | 443 | 0.0503 | 11.3 | 6.89 | 2.2 | 15.2 |
| $V_{16C'}$ = 1500 V<br>$V_{16C}$ = 0 V | 507 | 0.052 | 11.0 | 5.80 | 1.92 | 12.9 |
| $V_{16C'}$ = 2000 V<br>$V_{16C}$ = 0 V | 538 | 0.0511 | 11.1 | 5.29 | 1.78 | 11.6 |
| $V_{16C'}$ = 2500 V<br>$V_{16C}$ = 0 V | 555 | 0.049 | 11.5 | 5.03 | 1.70 | 12 |
| $V_{16C'}$ = 3000 V<br>$V_{16C}$ = 0 V | 561 | 0.048 | 12 | 4.87 | 1.64 | 12.2 |

Using the similar working conditions in the lens arrangement of FIG. 2 (with no additional electrode 16C') provides the following:

| OLC (mA) | M | NA (mrad) | Csph (mm) | Chr (mm) | Blur* (nm) |
|---|---|---|---|---|---|
| 338 | 0.0425 | 13.4 | 5.94 | 2.80 | 22.5 |

FIG. 3B shows the image blur as a function of voltage applied to the additional electrode 16C' (graph $H_1$–Blur=f($V_{16C'}$)) and the chromatic aberration coefficient as a function of voltage applied to the additional electrode 16C' (graph $H_2$–Cchr=f($V_{16C'}$)), while operating with the normal incidence of the primary beam onto the sample (sample perpendicular to the optical axis of the lens arrangement), $V_{16C}=0$ V, and WD=1.5 mm. FIG. 3C shows the image blur and chromatic aberration as functions of $V_{16\ C'}$, while operating with the normal incidence and HAR mode ($V_{16C}=3$ kV). As shown, increasing $V_{16C'}$ provides for the reduction of the chromatic aberration and the image blur (increase of resolution).

The following table presents the dependency of the entire set of measurable parameters (including also the lens magnification M, numerical aperture NA, and spherical aberration $C_{sph}$) on the voltages applied to the electrodes 16C and 16C':

| | OLC (mA) | M | NA (mrad) | Csph (mm) | Chr (mm) | Blur* (nm) |
|---|---|---|---|---|---|---|
| $V_{16C'}$ = 700 V<br>$V_{16C}$ = 0 V | 501 | 0.0489 | 11.6 | 5.36 | 1.78 | 12.7 |
| $V_{16C'}$ = 700 V<br>$V_{16C}$ = 0 V | 501 | 0.0489 | 11.6 | 5.36 | 1.78 | 12.7 |
| $V_{16C'}$ = 1000 V<br>$V_{16C}$ = 0 V | 552 | 0.0518 | 11.0 | 4.65 | 1.54 | 10.4 |
| $V_{16C'}$ = 2000 V<br>$V_{16C}$ = 0 V | 629 | 0.055 | 10.3 | 3.58 | 1.17 | 7.65 |
| $V_{16C'}$ = 3000 V<br>$V_{16C}$ = 0 V | 659 | 0.054 | 10.5 | 3.03 | 1.01 | 6.85 |
| $V_{16C'}$ = 4000 V | 671 | 0.052 | 11.0 | 2.59 | 0.92 | 6.55 |

-continued

| | OLC (mA) | M | NA (mrad) | Csph (mm) | Chr (mm) | Blur* (nm) |
|---|---|---|---|---|---|---|
| $V_{16C} = 0$ V $V_{16C'} = 3000$ V | 697 | 0.0678 | 8.38 | 5.66 | 0.78 | 5.36 |
| $V_{16C} = 3000$ V $V_{16C'} = 4000$ V | 713 | 0.069 | 8.7 | 5.69 | 0.74 | 5.21 |
| $V_{16C} = 3000$ V $V_{16C'} = 5000$ V | 721 | 00.068 | 8.3 | 2.44 | 0.70 | 5.07 |
| $V_{16C} = 3000$ V $V_{16C'} = 6000$ V | 725 | 0.067 | 8.46 | 5.02 | 0.67 | 4.96 |
| $V_{16C} = 3000$ V $V_{16C'} = 7000$ V | 726 | 0.065 | 8.7 | 4.53 | 0.64 | 4.85 |
| $V_{16C} = 3000$ V | | | | | | |

Using the similar working conditions in the lens arrangement of FIG. 2 (with no additional electrode 16C') provides the following:

| | OLC (mA) | M | NA (mrad) | Csph (mm) | Chr (mm) | Blur* (nm) |
|---|---|---|---|---|---|---|
| $V_{16C} = 0.$ | 494.6 | 0.0449 | 12.65 | 3.63 | 1.97 | 14.8 |
| $V_{16C} = 3$ kV | 707.5 | 0.0693 | 8.19 | 5.67 | 0.76 | 5.26 |

It is evident from the above experimental results that the use of the lens arrangement of the present invention comprising the additional electrode 16C' provides for better system performance as compared to that of the lens arrangement of FIG. 2. With the lens arrangement of the present invention, the resolution at 600 eV—energy primary beam and 45°-mechanical tilt is better by 30–40%, than that obtainable with the lens arrangement of FIG. 2. At normal incidence, the resolution is almost the same with the lens arrangement of the present invention, and that of FIG. 2. The simulations have shown that the minimal energy of the primary beam that can be focused onto the sample with the lens arrangement of FIG. 2 is 500 eV, while with the lens arrangement of the present invention, this minimal energy is reduced to 230 eV. As for the shift of the primary charged particle beam, while operating with the 45° mechanical tilt and the lens arrangement of the present invention, the shift is about 22 μm at $V_{16C'}$=2000V and about 8 μm at $V_{16C'}$= 2000V. Secondary electrons can be effectively collected by the in-lens and outside dectors.

It is noted that further experiments conducted by the inventors led to a resolution of about 3 nanometers at 1 keV beam lending energy and WD (work distance)=1.2 mm and about 4 nanometers at 600 eV and WD=2.5 mm, thus better results were achieved than previously expected in view of the simulation that provided resolution of 4 nanometers at 1 keV and resolution of 5.5 nanometers at 600 eV.

Those skilled in the art will readily appreciate that various modifications and changes can be applied to the embodiments of the invention as hereinbefore exemplified without departing from its scope defined in and by the appended claims.

What is claimed is:

1. An objective lens arrangement for mounting in a charged particle beam column adjacent to an anode tube that defines a beam drift space for a charged particle beam propagating towards a sample, the lens arrangement comprising a magnetic lens and an electrostatic lens, wherein the magnetic lens includes coils, upper and lower polepieces; and wherein the electrostatic lens includes upper and lower electrodes arranged in a spaced-apart coaxial relationship along an optical axis of the lens arrangement, said lower and upper electrodes of the electrostatic lens are formed by, respectively, the lower polepiece of the magnetic lens and the electrode located between the upper and lower polepieces of the magnetic lens.

2. The lens arrangement of claim 1, wherein at least the lower electrode is conically shaped.

3. The lens arrangement of claim 1, wherein said upper and lower electrodes are conically shaped.

4. The lens arrangement of claim 1, wherein said upper and lower electrodes are made of mu-metal.

5. The lens arrangement of claim 1, wherein the lower polepiece of the magnetic lens having a substantially conical shape.

6. The lens arrangement of claim 5, wherein one of said upper and lower electrodes has an additional conical part extended from the center of the cone so as to be around a bottom end of the lower polepiece of the magnetic lens.

7. The lens arrangement of claim 1, wherein the electrostatic lens is operable by a voltage supply to the anode tube, said upper and lower electrodes, and the sample.

8. The lens arrangement of claim 1, wherein said upper electrode is a multiple-electrode structure.

9. The lens arrangement of claim 8, wherein said upper electrode is configured as one of the following structures: dipole, quadruple, or octuple.

10. The lens arrangement of claim 8, wherein said multiple-electrode structure operates as a beam deflector.

11. The lens arrangement of claim 1, wherein said upper electrode is supplied with a positive voltage.

12. An objective lens arrangement for mounting in a charged particle beam column adjacent to an anode tube that defines a beam drift space for a charged particle beam propagating towards a sample, the lens arrangement comprising a means for creating a magnetic field and a means for creating an electrostatic field, wherein said means for creating the magnetic field includes coils, upper and lower magnetic polepieces; and wherein said means for creating the electrostatic field includes upper and lower electrodes arranged in a spaced-apart coaxial relationship along an optical axis of the lens arrangement, said lower and upper electrodes of the electrostatic lens are formed by, respectively, the lower polepiece of the magnetic lens and the electrode located between the upper and lower polepieces of the magnetic lens, and each of the upper and lower electrodes being associated with a separate voltage supply.

13. A charged particle beam column for monitoring a sample, the column comprising an anode tube that defining a beam drift space for a charged particle beam propagation towards the sample, and an objective lens arrangement mounted adjacent to said anode tube such that an optical axis of the lens arrangement substantially coincides with a longitudinal axis of the anode tube, the lens arrangement comprising a magnetic lens and an electrostatic lens, wherein the magnetic lens includes coils, upper and lower polepieces; and wherein the electrostatic lens includes upper and lower electrodes arranged in a spaced-apart coaxial relationship along the optical axis of the lens arrangement, said lower and upper electrodes of the electrostatic lens are formed by, respectively, the lower polepiece of the magnetic lens and the electrode located between the upper and lower polepieces of the magnetic lens.

14. A method of focusing a charged particle beam onto a sample while propagating through a charged particle beam column, the method comprising: passing the charged particle beam through an objective lens arrangement having a magnetic lens and an electrostatic lens, wherein the magnetic lens includes coils, upper and lower polepieces, and the electrostatic lens includes upper and lower electrodes arranged in a spaced-apart coaxial relationship along an optical axis of the lens arrangement, wherein said lower and upper electrodes of the electrostatic lens are formed by, respectively, the lower polepiece of the magnetic lens and the electrode located between the upper and lower polepieces of the magnetic lens; applying a predetermined voltage to said upper electrode to adjust a position of a principal plane of the lens arrangement to provide a desired magnification coefficient and numerical aperture of the lens arrangement.

15. A method of focusing a charged particle beam onto a sample with reduced chromatic aberration, while propagating the beam through a charged particle beam column, the method comprising: passing the charged particle beam through an objective lens arrangement having a magnetic lens and an electrostatic lens, wherein the magnetic lens includes coils, upper and lower polepieces; wherein the electrostatic lens includes upper and lower electrodes arranged in a spaced-apart coaxial relationship along an optical axis of the lens arrangement, said lower and upper electrodes of the electrostatic lens are formed by, respectively, the lower polepiece of the magnetic lens and the electrode located between the upper and lower polepieces of the magnetic lens; and regulating a voltage supply to said upper electrode.

16. The method of claim 15, wherein the sample and the objective lens arrangement are oriented with respect to each other with a certain non-right angle between the sample's plane and the optical axis of the lens arrangement.

17. The method of claim 16, wherein the said angle being about 45 degrees, zero voltage supply to the lower electrode and an effective working distance of 2.5 mm, the chromatic aberration is reduced to 1.64 mm for the charged particle beam energy of 600 eV.

18. The method of claim 15, wherein with normal incidence of the charged particle beam onto the sample, zero voltage supply to the lower electrode and an effective working distance of 1.5 mm, the chromatic aberration us reduced to 0.92 mm for the charged particle beam energy of 600 eV.

19. The method of claim 15, wherein with normal incidence of the charged particle beam onto the sample, 3 kV voltage supply to the lower electrode and an effective working distance of 1.5 mm, the chromatic aberration is reduced to 0.64 mm for the charged particle beam energy of 600 eV.

20. A method of focusing a charged particle beam onto a sample while propagating through a charged particle beam on its way towards an objective lens arrangement and decelerating the accelerated charged particle beam in the vicinity of the sample, wherein said decelerating compromises passing the charged particle beam through openings in upper and lower electrodes arranged in a spaced-apart coaxial relationship along the beam propagation axis, said lower and upper electrodes of the electrostatic lens are formed by, respectively, the lower polepiece of the magnetic lens and the electrode located between the upper and lower polepieces of the magnetic lens, thereby reducing a minimal energy of the effectively focusable charged particle beam.

21. The method of claim 16, wherein said minimal energy is 230 eV.

* * * * *